United States Patent
Crippen et al.

(10) Patent No.: US 6,688,965 B1
(45) Date of Patent: Feb. 10, 2004

(54) INVERTIBLE BACK FLOW DAMPER FOR AN AIR MOVING DEVICE

(75) Inventors: Martin Joseph Crippen, Apex, NC (US); Francis A. Kuchar, Jr., Raleigh, NC (US); Jason Aaron Matteson, Raleigh, NC (US); Brian Alan Trumbo, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/306,371

(22) Filed: Nov. 27, 2002

(51) Int. Cl.[7] .................................................. H05K 5/00
(52) U.S. Cl. ........................................ 454/184; 361/695
(58) Field of Search ............................ 454/184; 361/695

(56) References Cited

U.S. PATENT DOCUMENTS 5,414,591 A * 5/1995 Kimura et al. .............. 361/695
5,793,610 A * 8/1998 Schmitt et al. .............. 361/695
6,031,717 A * 2/2000 Baddour et al. ............. 361/687

* cited by examiner

*Primary Examiner*—Jiping Lu
(74) *Attorney, Agent, or Firm*—Martin J. McKinley

(57) ABSTRACT

An air moving system such as a fan or blower system includes a back flow damper that functions in two orientations; non-inverted and inverted. First and second "end" baffles are pivotally attached at opposite ends of the damper, and three "middle" baffles are pivotally attached between the two end baffles. When the air moving system fails in the non-inverted orientation, the first end baffle and the three middle baffles are gravity operated to close off the air outlet to prevent the back flow of air, and the second end baffle pivots away from the outlet. When the air moving device fails in the inverted orientation, the second end baffle and the three middle baffles operate to close off the air outlet, and the first end baffle pivots away from the outlet. The three middle baffles are pivotally coupled to a connecting rod, which prevents the inadvertent jamming of baffles.

8 Claims, 7 Drawing Sheets

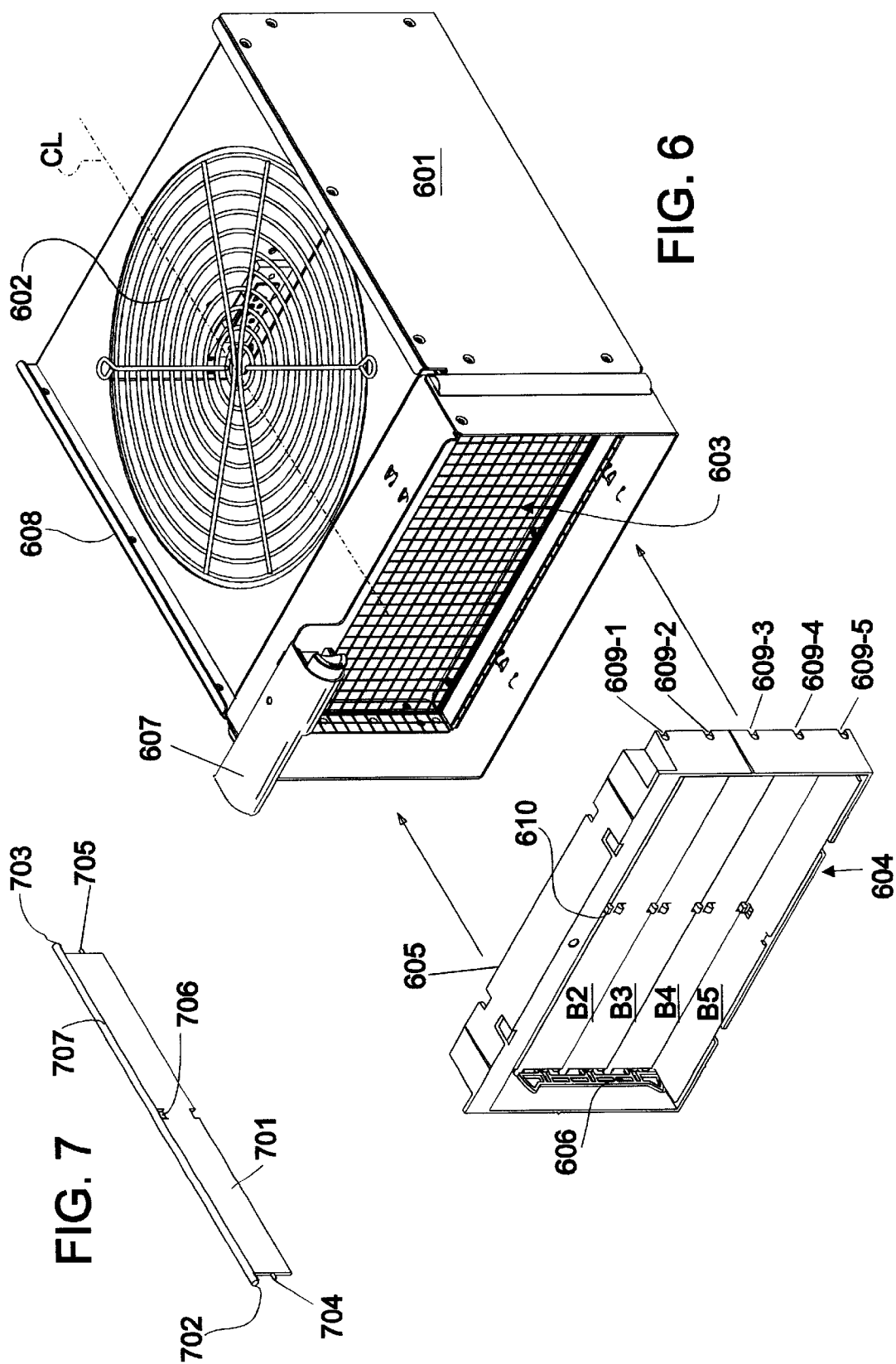

US 6,688,965 B1

INVERTIBLE BACK FLOW DAMPER FOR AN AIR MOVING DEVICE

BACKGROUND OF THE INVENTION

This invention pertains to computers and other information processing systems and, more particularly, to an air moving device such as a fan or blower that includes a back flow damper that is functional in either of two orientations; non-inverted and inverted.

High reliability in computer systems, such as server blade system, can be achieved through the use of redundant components including redundant cooling devices, such as fans, blowers and other air moving devices. In one design for a server blade system, air is moved through the various components of the system and, ultimately, into a plenum positioned at the back of the main chassis CH1 and located between two blower units. The position of such a plenum is visible in FIG. 1 as the space between the two blowers BL1 and BL2.

Since air is moved through the server blade system of FIG. 1 by up to two blowers BL1 and BL2, and since both blowers draw air in from the same plenum, the failure of one blower would result in the back flow of air through the failed blower and into the plenum. Since the back flow of air through the failed blower is a low resistance path, while the preferred air flow through the system components is a higher resistance path, the failure of one of the blowers would result in a significant drop in the air flow rate through the system components; as the majority of the air flow is drawn through the failed blower. The solution to this problem is to place a back flow damper on both blowers, such that if one of the blowers fails, the dampers on the failed blower will close to prevent back flow through the failed blower.

Since blowers BL1 and BL2 are mounted one above the other, and since they both draw air in from the same plenum, which is located between the two blowers, then one blower must be inverted relative to the other blower such that the air inlet of both the upper and lower blowers is adjacent the air intake plenum in the server blade chassis. Accordingly, the invention described below is an air moving device that can function in either of two orientations, such that it can be installed in the lower blower bay of a server blade system, or inverted and also installed in the upper blower bay. More importantly, this air moving device includes a back flow damper that functions in both orientations.

SUMMARY OF THE INVENTION

Briefly, the invention is an air moving device assembly including a housing having an air inlet and an air outlet. The air moving device assembly has a first orientation wherein the air inlet is oriented in a first direction, and a second orientation wherein the air inlet is oriented in a second direction substantially opposite the first direction. An air moving device is located within the housing for moving air from the air inlet to the air outlet. A back flow damper assembly is positioned over the air outlet and includes: 1) a first end baffle pivotally attached to a first end of the back flow damper assembly; 2) a second end baffle pivotally attached to a second end of the back flow damper assembly, the second end being substantially opposite said first end, and 3) at least two middle baffles pivotally attached to the back flow damper assembly between the first and second end baffles. When the air moving device assembly is in the first orientation and in the event of a failure of the air moving device, the first end baffle and the two middle baffles cover the air outlet to prevent the back flow of air through the air outlet, and the second end baffle pivots away from the air outlet so as not to block the back flow of air though the air outlet. When the air moving device assembly is in the second orientation and in the event of a failure of the air moving device, the second end baffle and the two middle baffles cover the air outlet to prevent the back flow of air through the air outlet, and the first end baffle pivots away from the air outlet so as not to block the back flow of air though the air outlet.

BRIEF DESCRIPTION OF THE DRAWINGS

FIG. 6 is a perspective view of the air moving device with the back flow damper assembly removed therefrom.

FIG. 7 is a perspective view of one of the baffles of the back flow damper assembly.

DESCRIPTION OF THE ILLUSTRATIVE EMBODIMENTS

Server Blade System Overview

Figure 1:
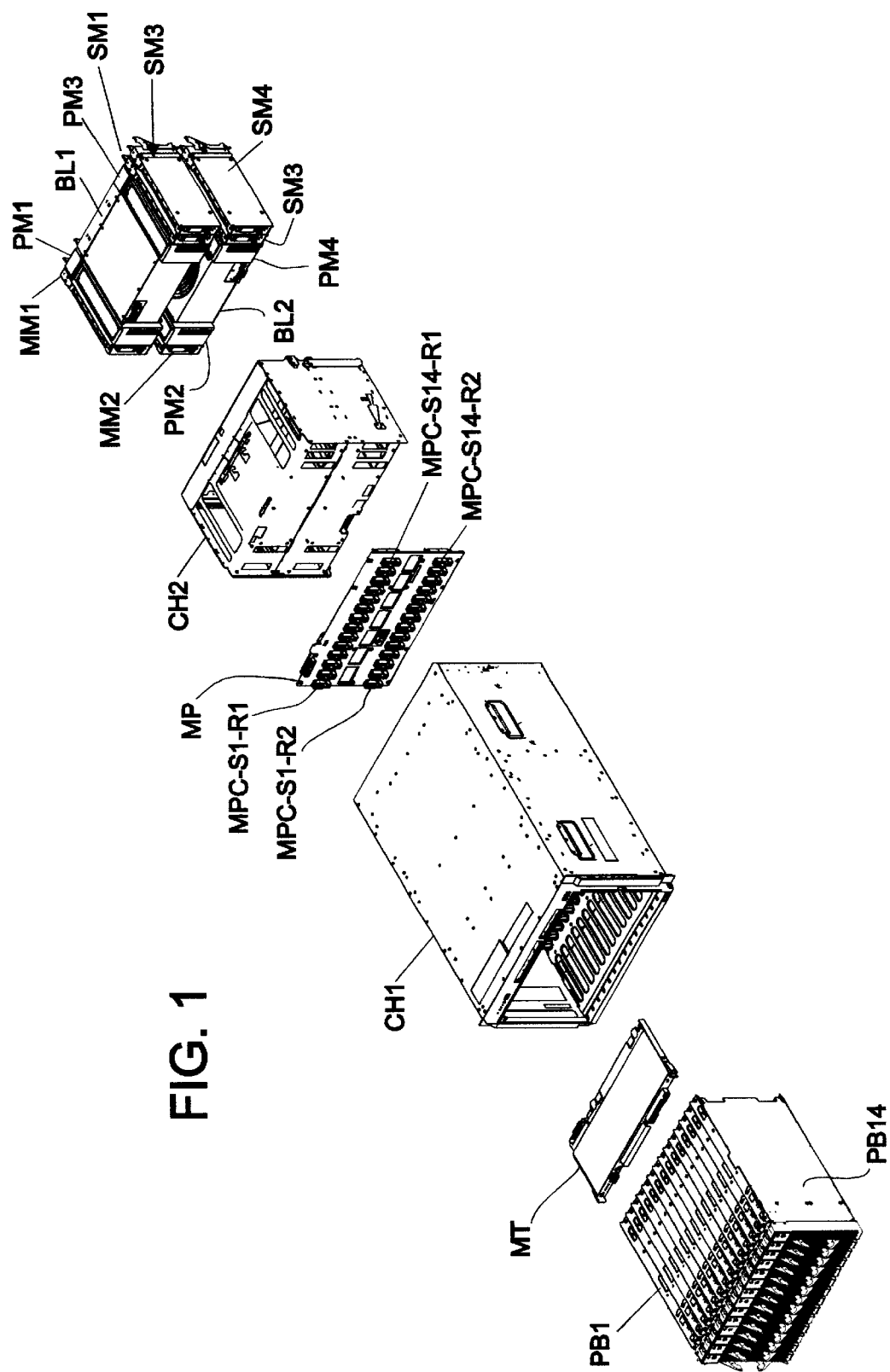
FIG. 1 is a front, top and right side exploded perspective view of a server blade system of the present invention.

FIG. 1 is a front, top and right side exploded perspective view of a server blade system. Referring to this figure, main chassis CH1 houses all the components of the server blade system. Up to 14 processor blades PB1 through PB14 (or other blades, such as storage blades) are hot plugable into the 14 slots in the front of chassis CH1. The term "server blade", "processor blade", or simply "blade" is used throughout the specification and claims, but it should be understood that these terms are not limited to blades that only perform "processor" or "server" functions, but also include blades that perform other functions, such as storage blades, which typically include hard disk drives and whose primary function is data storage.

Processor blades provide the processor, memory, hard disk storage and firmware of an industry standard server. In addition, they include keyboard, video and mouse ("KVM") selection via a control panel, an onboard service processor, and access to the floppy and CD-ROM drives in the media tray. A daughter card is connected via an onboard PCI-X interface and is used to provide additional high-speed links to switch modules SM3 and SM4 (described below). Each processor blade also has a front panel with 5 LED's to indicate current status, plus four push-button switches for power on/off, selection of processor blade, reset, and NMI for core dumps for local control.

Blades may be 'hot swapped' without affecting the operation of other blades in the system. A server blade is typically implemented as a single slot card (394.2 mm×226.99 mm); however, in some cases a single processor blade may require two slots. A processor blade can use any microprocessor technology as long as it compliant with the mechanical and electrical interfaces, and the power and cooling requirements of the server blade system.

For redundancy, processor blades have two signal and power connectors; one connected to the upper connector of the corresponding slot of midplane MP (described below), and the other connected to the corresponding lower connector of the midplane. Processor Blades interface with other components in the server blade system via the following midplane interfaces: 1) Gigabit Ethernet (2 per blade; required); 2) Fibre Channel (2 per blade; optional); 3) management module serial link; 4) VGA analog video link; 4) keyboard/mouse USB link; 5) CD-ROM and floppy disk drive ("FDD") USB link; 6) 12 VDC power; and 7) miscellaneous control signals. These interfaces provide the ability to communicate to other components in the server blade system such as management modules, switch modules, the CD-ROM and the FDD. These interfaces are duplicated on the midplane to provide redundancy. A processor blade typically supports booting from the media tray CDROM or FDD, the network (Fibre channel or Ethernet), or its local hard disk drive.

A media tray MT includes a floppy disk drive and a CD-ROM drive that can be coupled to any one of the 14 blades. The media tray also houses an interface board on which is mounted interface LED's, a thermistor for measuring inlet air temperature, and a 4-port USB controller hub. System level interface controls consist of power, location, over temperature, information, and general fault LED's and a USB port.

Midplane circuit board MP is positioned approximately in the middle of chassis CH1 and includes two rows of connectors; the top row including connectors MPC-S1-R1 through MPC-S14-R1, and the bottom row including connectors MPC-S1-R2 through MPC-S14-R2. Thus, each one of the 14 slots includes one pair of midplane connectors located one above the other (e.g., connectors MPC-S1-R1 and MPC-S1-R2) and each pair of midplane connectors mates to a pair of connectors at the rear edge of each processor blade (not visible in FIG. 1).

Figure 2:
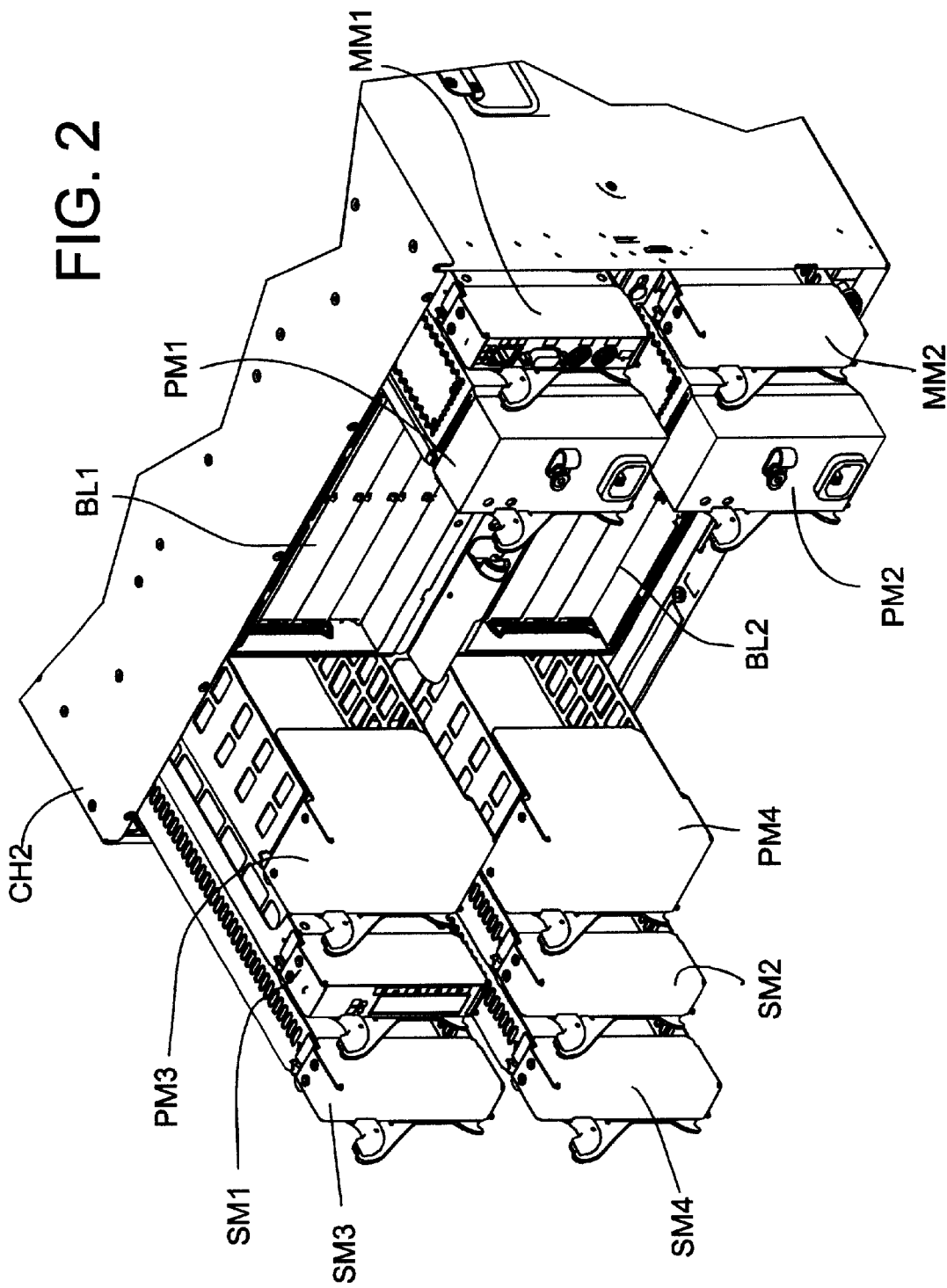
FIG. 2 is a rear, top and left side perspective view of the rear portion of the server blade system.

FIG. 2 is a rear, top and left side perspective view of the rear portion of the server blade system. Referring to FIGS. 1 and 2, a chassis CH2 houses various hot plugable components for cooling, power, control and switching. Chassis CH2 slides and latches into the rear of main chassis CH1.

Two hot plugable blowers BL1 and BL2 include backward-curved impeller blowers and provide redundant cooling to the server blade system components. Airflow is from the front to the rear of chassis CH1. Each of the processor blades PB1 through PB14 includes a front grille to admit air, and low-profile vapor chamber based heat sinks are used to cool the processors within the blades. Total airflow through the system chassis is about 300 CFM at 0.7 inches H2O static pressure drop. In the event of blower failure or removal, the speed of the remaining blower automatically increases to maintain the required air flow until the replacement unit is installed. Blower speed control is also controlled via a thermistor that constantly monitors inlet air temperature. The temperature of the server blade system components are also monitored and blower speed will increase automatically in response to rising temperature levels as reported by the various temperature sensors.

Four hot plugable power modules PM1 through PM4 provide DC operating voltages for the processor blades and other components. One pair of power modules provides power to all the management modules and switch modules, plus any blades that are plugged into slots 1–6. The other pair of power modules provides power to any blades in slots 7–14. Within each pair of power modules, one power module acts as a backup for the other in the event the first power module fails or is removed. Thus, a minimum of two active power modules are required to power a fully featured and configured chassis loaded with 14 processor blades, 4 switch modules, 2 blowers, and 2 management modules. However, four power modules are needed to provide full redundancy and backup capability. The power modules are designed for operation between an AC input voltage range of 200 VAC to 240 VAC at 50/60 Hz and use an IEC320 C14 male appliance coupler. The power modules provide +12 VDC output to the midplane from which all server blade system components get their power. Two +12 VDC midplane power buses are used for redundancy and active current sharing of the output load between redundant power modules is performed.

Management modules MM1 through MM4 are hot-pluggable components that provide basic management functions such as controlling, monitoring, alerting, restarting and diagnostics. Management modules also provide other functions required to manage shared resources, such as the ability to switch the common keyboard, video, and mouse signals among processor blades.

Figure 3:
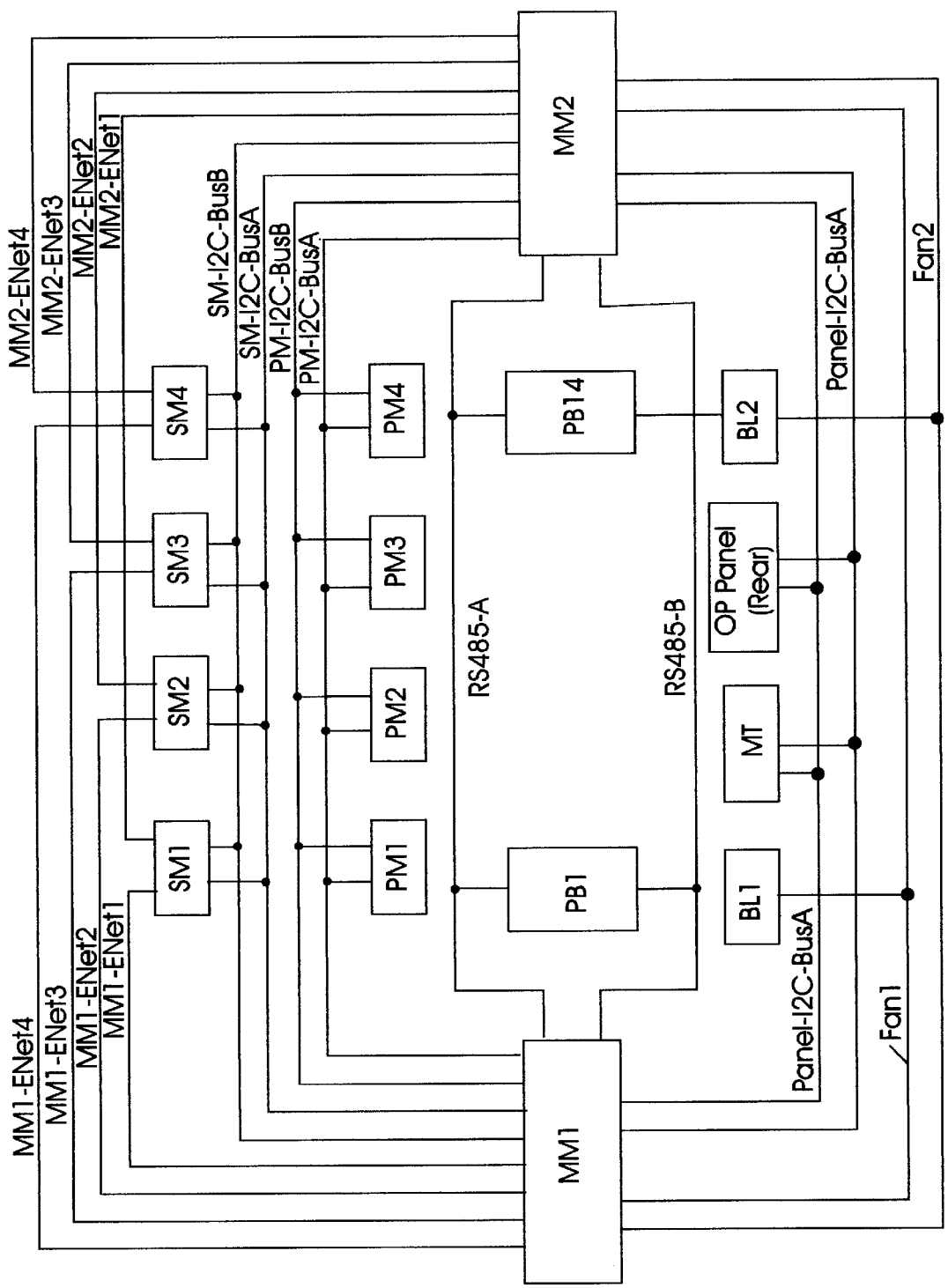
FIG. 3 is a schematic diagram of the server blade system's management subsystem.

FIG. 3 is a schematic diagram of the server blade system's management subsystem. Referring to this figure, each management module has a separate Ethernet link to each one of the switch modules SM1 through SM4. Thus, management module MM1 is linked to switch modules SM1 through SM4 via Ethernet links MM1-ENet1 through MM1-ENet4, and management module MM2 is linked to the switch modules via Ethernet links MM2-ENet1 through MM2-ENet4. In addition, the management modules are also coupled to the switch modules via two well known serial I2C buses SM-I2C-BusA and SM-I2C-BusB, which provide for "out-of-band" communication between the management modules and the switch modules. Similarly, the management modules are also coupled to the power modules PM1 through PM4 via two serial I2C buses PM-I2C-BusA and PM-I2C-BusB. Two more I2C buses Panel-I2C-BusA and Panel-I2C-BusB are coupled to media tray MT and the rear panel. Blowers BL1 and BL2 are controlled over separate serial buses Fan1 and Fan2. Two well known RS485 serial buses RS485-A and RS485-B are coupled to server blades PB1 through PB14 for "out-of-band" communication between the management modules and the server blades.

Figure 4:
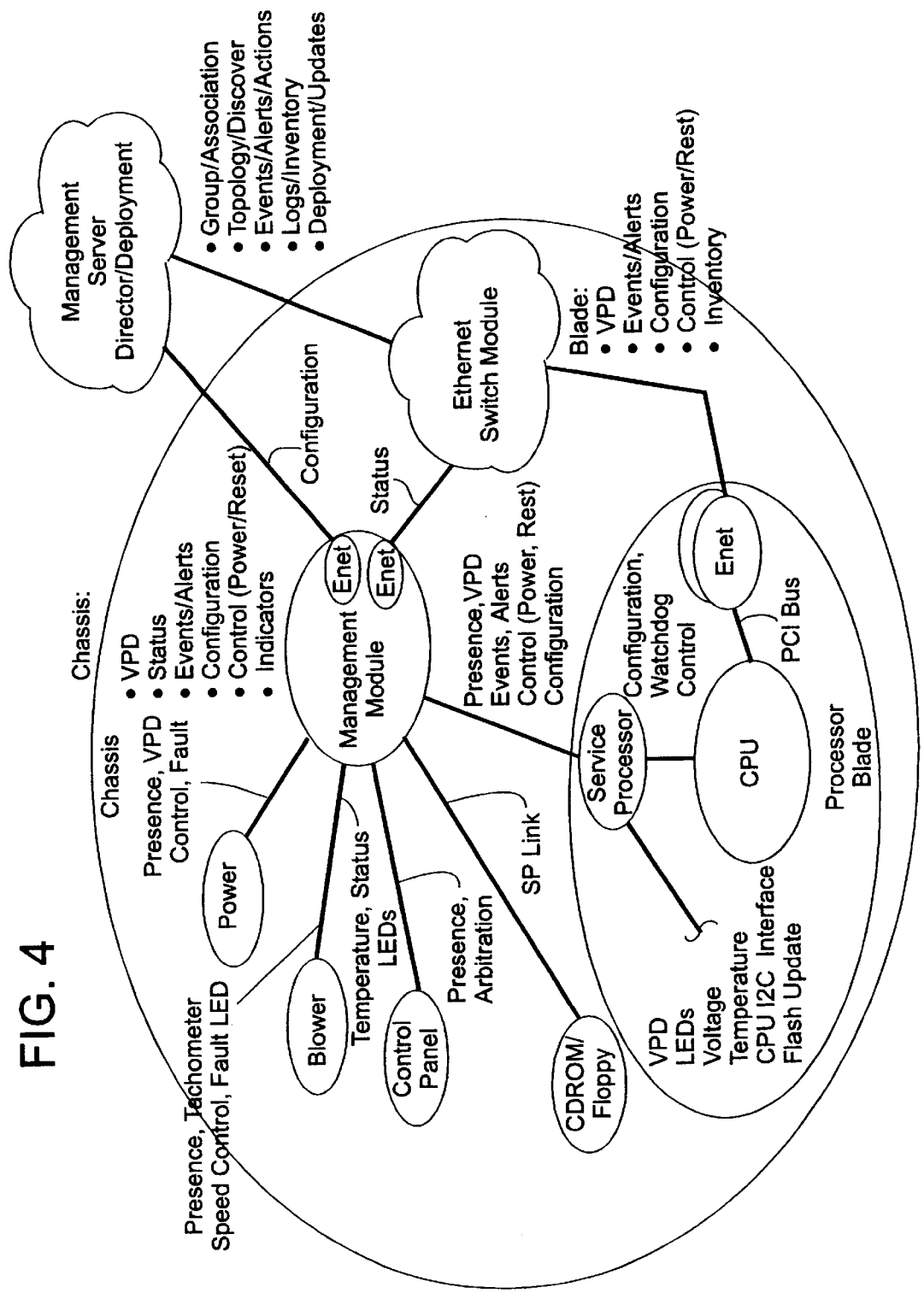
FIG. 4 is a topographical illustration of the server blade system's management functions.

FIG. 4 is a topographical illustration of the server blade system's management functions. Referring to FIGS. 3 and 4, each of the two management modules has a 100 Mbps Ethernet port that is intended to be attached to a private, secure management server. The management module firmware supports a web browser interface for either direct or remote access. Each processor blade has a dedicated service processor (SP) for sending and receiving commands to and from the management modules. The data ports that are associated with the switch modules can be used to access the processor blades for image deployment and application management, but are not intended to provide chassis management services. A management and control protocol allows the management module to authenticate individual blades as part of the blade activation procedure. A management module can also send alerts to a remote console to indicate changes in status, such as removal or addition of a blade or module. A management module also provides access to the internal management ports of the switch modules and to other major chassis subsystems (power, cooling, control panel, and media drives).

The management module communicates with each processor blade service processor via the out-of-band serial bus, with one management module acting as the master and the processor blade's service processor acting as a slave. For redundancy, there are two serial busses (one bus per midplane connector) to communicate with each processor blade's service processor. The processor bade is responsible for activating the correct interface to the top or bottom midplane connector based upon the state of the signals from the active management module. When two management modules are installed, the module in slot 1 will normally assume the active management role, while the module in slot 2 will be reserved as a standby module. In event of management module failure or removal after the chassis subsystems have been initialized, the operation of the processor blades and switch subsystems are not affected. Thus, if both management modules are inactive or removed, the server blade system's components will continue to function, but chassis configuration cannot be changed. Addresses are hardwired for each slot on each top and bottom midplane connector, and used by a processor blade's service processor to determine which processor blade is being addressed on the serial bus.

Each of the four switch modules SM1 through SM4 has a dedicated 100 Mbps Ethernet link to the two management modules MM1 and MM2. This provides a secure high-speed communication path to each of the switch modules for control and management purposes only. The I2C serial links are used by the management module to internally provide control of the switch module and to collect system status and vendor product data ("VPD") information. To accomplish this, the various control and data areas within the switch modules, such as status and diagnostic registers and VPD information, are accessible by the management module firmware. In general, the active management module can detect the presence, quantity, type, and revision level of each blade, power module, blower, and midplane in the system, and can detect invalid or unsupported configurations (e.g., processor blades with Fibre Channel daughter cards connected to Ethernet switch modules.) This function relies upon VPD information within each subsystem as well as signals from the various hardware interfaces or communication via the service processor protocols.

Figure 5:
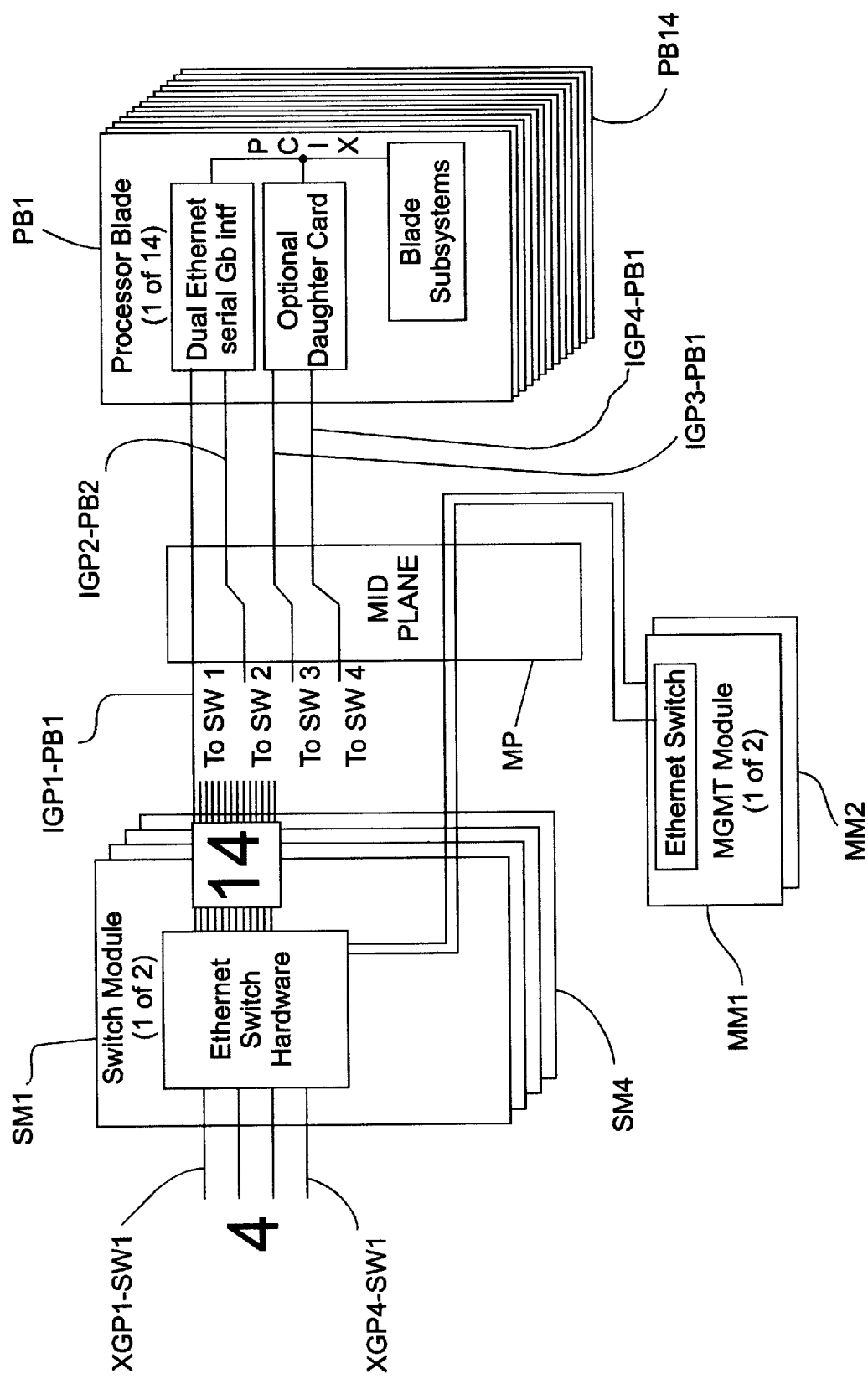
FIG. 5 is a block diagram of the switch module and processor blade interconnection.

FIG. 5 is a block diagram of the switch module and processor blade interconnection. Referring to this figure, each switch module SW1 through SW4 includes four external gigabit ports. For example, switch module SW1 includes external gigabit ports XGP1-SW1 through XGP4-SW1. Each processor blade includes four internal gigabit ports coupling the processor blade to each one of the four switch modules through the midplane connectors. For example, processor blade PB1 includes four internal gigabit ports IGP1-PB1 through IGP4-PB1. In addition, each management module is coupled to the switch module via an Ethernet link.

The Ethernet Switch Modules are hot-pluggable components that provide Ethernet switching capabilities to the server blade system. The primary purpose of the switch module is to provide Ethernet interconnectivity between the processor blades, management modules and the outside network infrastructure. Depending on the application, the external Ethernet interfaces may be configured to meet a variety of requirements for bandwidth and function. One Ethernet switch module is included in the base system configuration, while a second Ethernet switch module is recommended for redundancy. Each processor blade has a dedicated, 1000 Mbps (1 Gbps) full-duplex SERDES link to each of the two switch modules, and each switch module has four external 1 Gbps (RJ45) ports for connection to the external network infrastructure.

Fibre Channel (FC) is an industry standard networking scheme for sharing remote storage devices among a group of servers. Each processor blade includes a connector to accept a Fibre Channel daughter board containing two Fibre Channel ports of 2 Gb each for connection to dual Fibre Channel switch modules. The routing of the Fibre Channel signals occurs through the midplane to the Fibre Channel switch modules in slots 3 and 4 in the rear of the server blade chassis. Each Fibre Channel switch module is hot-pluggable without disruption of blade or chassis operation. The routing of the two Fibre Channel ports is such that one port from each processor blade is wired to one Fibre Channel switch module, and the other port is wired to the other Fibre Channel switch module to provide redundancy. Each Fibre Channel switch module has 2 external 2 Gb ports for attachment to the external Fibre Channel switch and storage infrastructure. This option allows each of the 14 processor blades to have simultaneous access to a Fibre Channel based storage area network (SAN) as well as the Ethernet based communications network.

The Invertible Back Flow Damper

FIG. 6 is a perspective view of the air moving device with the back flow damper assembly removed therefrom, and FIG. 7 is a perspective view of one of the baffles of the back flow damper assembly. Referring to these figures, air moving device 601 includes a well known blower although a fan or other air handling device could be used. Air moving device 601 includes a housing 608, having an air inlet 602 and an air outlet 603. Positioned over outlet 603 is back flow damper asembly 604, which includes damper frame 605. The damper assembly includes five pivotally mounted baffles B1 through B5; a typical baffle 701 is illustrated in more detail in FIG. 7.

In FIG. 7, baffle 701 includes hinge pins 702 and 702, which are inserted into hinge pins holes 609-1 through 609-5. All the baffles are identical in the preferred embodiment, so baffle 701 is representative of baffles B1–B5. A hole 706 is provided to receive a pair of protruding tabs (e.g., 610) that provide a snap fit around shaft 707 which extends between hinge pins 72 and 703. Since the baffle 701 is longs and flexible, these tabs (e.g., 610) provide a hinge in the middle of the baffle to offer additional and limit flexing of the baffle.

Baffle 701 also includes two connecting rod pins 704 and 705, which are inserted into hinge pin holes in connecting rod 606. Only the middle baffles B2–B4 are pivotally attached to the connecting rod via their respective pins 704 and 705. The connecting rod causes all three middle baffles B2–B4 to move in unison. Without the connecting rod, it is possible during the inversion of air moving device 601 for two of the baffles (e.g., B4 and B5) to "jam" (for example, B5 is in the "up" position and B4 is in the "down" position, such that B4 overlaps B5). When the blower motor is turned on and without the connecting rod, the force of the air through outlet 603 is insufficient to lift B4 off B5, to permit B5 to drop to its proper position adjacent damper frame 605 (for the non-inverted orientation of FIG. 6). But by connecting baffles B2–B4 together through connecting rod 606, the force of the exhaust air now acts on all three baffles, which in turn transmit sufficient lifting force to baffle B4 to lift it off baffle B5, thereby permitting baffle B5 to drop to its proper position.

Air handler 601 also includes a well known spring loaded latch 607, which is used to latch the air moving device into the chassis of the server blade system. Note that latch 607 is offset from center line CL. This offset permits the unit to be inverted and used in the upper blower bay BL2, such that the latch from the upper bay is adjacent the latch from the lower bay. While it would be possible to design a blower unti without this offset, the offset saves space because the latch from the uper unti "interlaces" with the latch from the lower unit in a side-by-side fashion.

Figure 8:
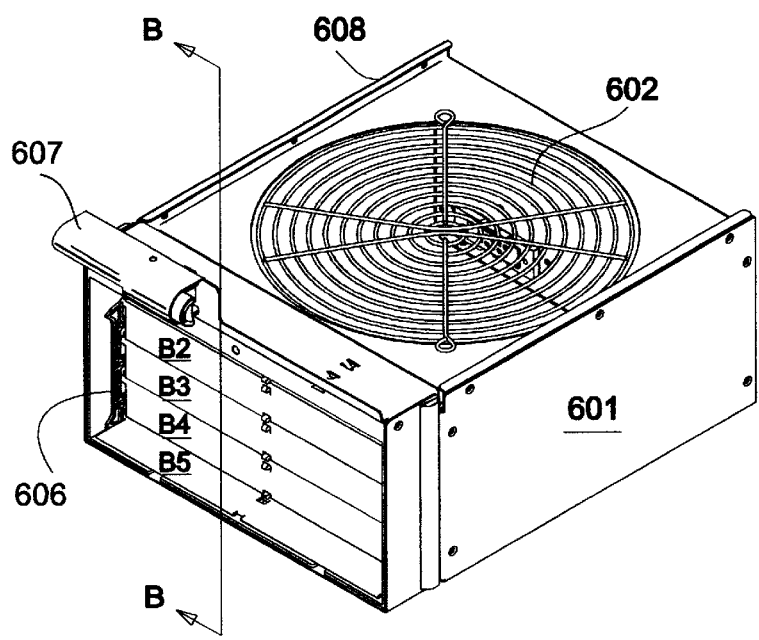
FIG. 8 is a perspective view of the air moving device is a first (non-inverted) orientation wherein the air flow inlet is facing up.
Figure 9:
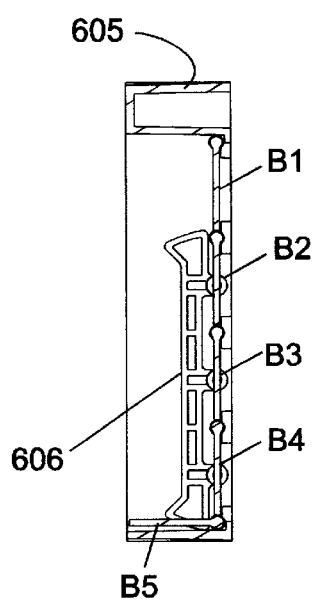
FIG. 9 is a cross sectional view of the back flow damper assembly along line B—B of FIG. 8.

FIG. 8 is a perspective view of the air moving device is then non-inverted orientation, and FIG. 9 is a cross sectional view of the back flow damper assembly along line B—B of FIG. 8. The position of the baffles in each of these figures in indicative of a failed blower (or one which is simply turned off). Referring to these figures, note that baffles B1–B4 obstruct the air outlet (603 in FIG. 6) while baffle B5 does not obstruct the outlet but, instead, lies flat against damper frame 605. Compare these drawings to those of FIGS. 10 and 11, which illustrate the air moving device in the inverted position.

Figure 10:
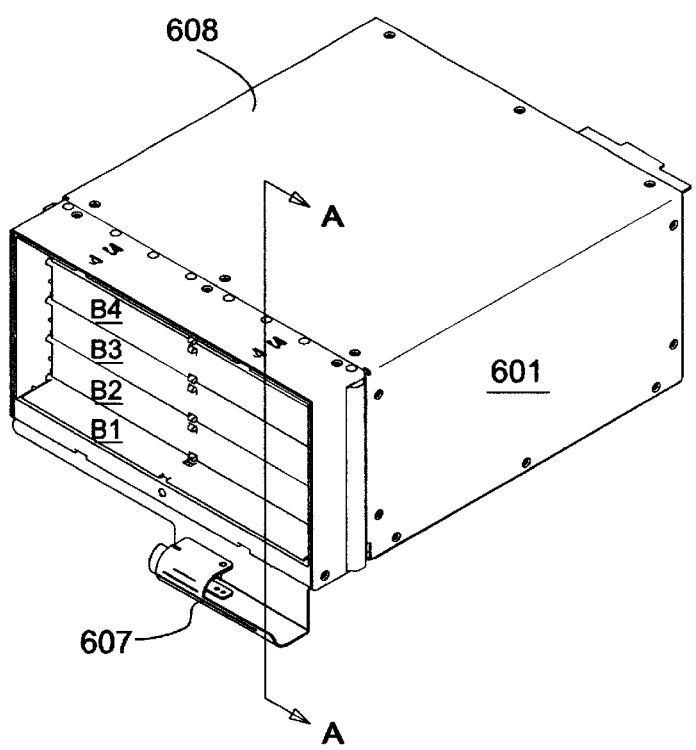
FIG. 10 is a perspective view of the air moving device is a second (inverted) orientation wherein the air flow inlet is facing down (the air flow inlet is not visible in this figure).
Figure 11:
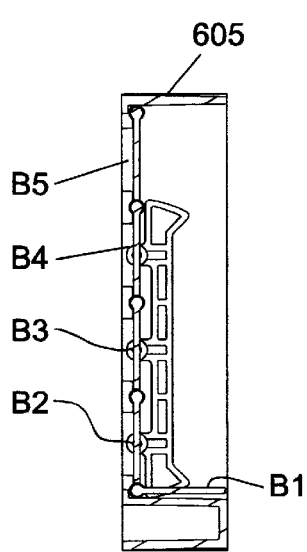
FIG. 11 is a cross sectional view of the back flow damper assembly along line A—A of FIG. 10.

Referring to FIGS. 10 and 11 wherein the position of the baffles in each of these figures is indicative of a failed blower (or one which is simply turned off) when the air handler is in the inverted position (air inlet 602 down). Note that baffles B2–B5 obstruct the air outlet (603 in FIG. 6) while baffle B1 does not obstruct the outlet but, instead, lies flat against damper frame 605.

We claim as our invention:

1. An air moving device assembly, comprising:
   a housing having an air inlet and an air outlet, said air moving device assembly having a first orientation wherein said air inlet is oriented in a first direction, and said air moving device assembly having a second orientation wherein said air inlet is oriented in a second direction substantially opposite said first direction;
   an air moving device within said housing for moving air from said air inlet to said air outlet;
   a back flow damper assembly positioned over said air outlet, said back flow damper assembly including:
      a first end baffle pivotally attached to a first end of said back flow damper assembly;
      a second end baffle pivotally attached to a second end of said back flow damper assembly, said second end being substantially opposite said first end;
      at least two middle baffles pivotally attached to said back flow damper assembly between said first and second end baffles;
   wherein, when said air moving device assembly is in said first orientation and in the event of a failure of said air moving device, said first end baffle and said two middle baffles cover said air outlet to prevent the back flow of air through said air outlet, and said second end baffle pivots away from said air outlet so as not to block the back flow of air though said air outlet; and
   when said air moving device assembly is in said second orientation and in the event of a failure of said air moving device, said second end baffle and said two middle baffles cover said air outlet to prevent the back flow of air through said air outlet, and said first end baffle pivots away from said air outlet so as not to block the back flow of air though said air outlet.

2. The air moving device assembly of claim 1, further comprising:
   a hinge pin attached to each of said two middle baffles;
   a connecting rod having two hinge pin holes for receiving said hinge pins of said two middle baffles, such that said two middle baffles move in unison.

3. The air moving device assembly of claim 2, further comprising a latch for removable coupling said air moving device assembly to an equipment housing, said latch being attached to said housing and offset to one side of a center line drawn through said housing.

4. The air moving device assembly of claim 1, further comprising a latch for removable coupling said air moving device assembly to an equipment housing, said latch being attached to said housing and offset to one side of a center line drawn through said housing.

5. A server blade assembly comprising:
   a main chassis having a slot for receiving a server blade, and having first and second bays for receiving an air moving device assembly;
   a power supply, management module, and switch module positioned in said main chassis;
   an air moving device assembly for moving air through said power supply, management module and switch module, said air moving device assembly comprising:
      a housing having an air inlet and an air outlet, said air moving device assembly having a first orientation when said air moving device assembly is installed in said first bay wherein said air inlet is oriented in a first direction, and said air moving device assembly having a second orientation when said air moving device assembly is installed in said second bay wherein said air inlet is oriented in a second direction substantially opposite said first direction;
      an air moving device within said housing for moving air from said air inlet to said air outlet;
      a back flow damper assembly positioned over said air outlet, said back flow damper assembly including:
         a first end baffle pivotally attached to a first end of said back flow damper assembly;
         a second end baffle pivotally attached to a second end of said back flow damper assembly, said second end being substantially opposite said first end;
         at least two middle baffles pivotally attached to said back flow damper assembly between said first and second end baffles;
   wherein, when said air moving device assembly is installed in said first bay and in the event of a failure of said air moving device, said first end baffle and said two middle baffles cover said air outlet to prevent the back flow of air through said air outlet, and said second end baffle pivots away from said air outlet so as not to block the back flow of air though said air outlet; and
   when said air moving device assembly is installed in said second bay and in the event of a failure of said air moving device, said second end baffle and said two middle baffles cover said air outlet to prevent the back flow of air through said air outlet, and said first end baffle pivots away from said air outlet so as not to block the back flow of air though said air outlet.

6. The server blade assembly of claim 5, wherein said air moving device assembly further comprises:

a hinge pin attached to each of said two middle baffles;

a connecting rod having two hinge pin holes for receiving said hinge pins of said two middle baffles, such that said two middle baffles move in unison.

7. The server blade assembly of claim 6, wherein said air moving device assembly further comprises a latch for removable coupling said air moving device assembly to said main chassis, said latch being attached to said housing and offset to one side of a center line drawn through said housing.

8. The server blade assembly of claim 5, wherein said air moving device assembly further comprises a latch for removable coupling said air moving device assembly to said main chassis, said latch being attached to said housing and offset to one side of a center line drawn through said housing.

* * * * *